(12) United States Patent
Seo et al.

(10) Patent No.: US 7,375,428 B2
(45) Date of Patent: May 20, 2008

(54) FLIP-CHIP BONDING STRUCTURE USING MULTI CHIP MODULE-DEPOSITED SUBSTRATE

(75) Inventors: Kwang-Seok Seo, Seoul (KR); Sang-Sub Song, Seoul (KR)

(73) Assignee: Seoul National University Industry Foundation, Seoul (KR)

( * ) Notice: Subject to any disclaimer, the term of this patent is extended or adjusted under 35 U.S.C. 154(b) by 183 days.

(21) Appl. No.: 11/302,635

(22) Filed: Dec. 14, 2005

(65) Prior Publication Data

US 2007/0001314 A1     Jan. 4, 2007

(30) Foreign Application Priority Data

Jul. 1, 2005     (KR)     .................. 10-2005-0001536

(51) Int. Cl.
*H01L 23/48*     (2006.01)
*H01L 23/52*     (2006.01)
*H01L 29/40*     (2006.01)

(52) U.S. Cl. .................. 257/737; 257/774; 257/778; 257/E23.021

(58) Field of Classification Search .............. 257/774, 257/778, 737, E23.021
See application file for complete search history.

(56) References Cited

U.S. PATENT DOCUMENTS

| | | | |
|---|---|---|---|
| 5,346,857 A | | 9/1994 | Scharr et al. |
| 6,087,719 A | * | 7/2000 | Tsunashima ................. 257/686 |
| 6,137,125 A | | 10/2000 | Costas et al. |
| 6,562,653 B1 | | 5/2003 | Ma et al. |
| 6,881,974 B2 | * | 4/2005 | Wood et al. ................... 257/48 |
| 6,936,918 B2 | * | 8/2005 | Harney et al. ............... 257/704 |
| 7,045,886 B2 | * | 5/2006 | Sawada ...................... 257/686 |
| 2007/0001266 A1 | * | 1/2007 | Arana et al. ................ 257/621 |

* cited by examiner

*Primary Examiner*—Nitin Parekh
(74) *Attorney, Agent, or Firm*—Thomas, Kayden, Horstemeyer & Risley

(57) ABSTRACT

Flip-chip bonding structures using an MCM-D substrate are disclosed. A flip-chip bonding structure using an MCM-D substrate includes: a silicon substrate, a Si-bump disposed at a predetermined position of the silicon substrate, wherein a material of the Si-bump is the same as the silicon substrate, a dielectric layer disposed on the silicon substrate and a transmission line formed on the Si-bump to connect to a circuit formed on the dielectric layer.

17 Claims, 9 Drawing Sheets

FLIP-CHIP BONDING STRUCTURE USING MULTI CHIP MODULE-DEPOSITED SUBSTRATE

BACKGROUND OF THE INVENTION

1. Field of the Invention

The present invention relates to a flip-chip technology; and, more particularly, to sa flip-chip bonding structure incorporating therein an MCM-D (Multi Chip Module-Deposited) substrate.

2. Background of the Related Art

As a consequence of the recent rapid increase in demand for more band-width, mm-wave applications such as a short-range broad-band wireless communication are currently attracting a great interest and a investment. In order, however, for these applications to be commercially viable, a commercial package technology capable of imparting compact and high-performance mm-wave modules with low manufacturing cost is a must. MCM-D technology is one of the best candidates for realizing this objective, because, as well as allowing system-on-package (SOP) approach as it is based on thin-film dielectric layers, it is capable of providing high resolution patterns, an absolute necessity for accommodating mm-wave frequency having very short wavelength. In addition, the flip-chip interconnection has a number of advantages over the wire-bonding interconnection. To mention a few, they include: (1) lower parasitic elements due to the shorter interconnection length; (2) lower assembly cost; and (3) higher reproducibility. Accordingly, by mounting active components such as a monolithic mm-wave integrated circuit (MMIC) or an active device on the MCM-D substrate by means of the flip-chip technology, the objective described above can be achieved.

There are some technical issues which must resolved, however, if the flip-chip technology is to be used as the interconnection between the active components and the MCM-D substrate in mm-wave applications, the issues, mainly relating to the inherent properties of the MCM-D substrate, such as the CTE (Coefficient of the Thermal Expansion), the thermal conductivity, the dielectric constant, and the suppression of package-related parasitic modes, all of which are critical to the over-all performance of the module. The above mentioned properties are critical in that: (1) the CTE of the MCM-D substrate has to be similar to that of the active components mounted on the MCM-D substrate to improve the thermo-mechanical reliability of the flip-chip structure; (2) the MCM-D substrate must have a high thermal conductivity to effectively dissipate the heat generated by the active components; (3) the MCM-D substrate should have a low dielectric constant to reduce the proximity effect between the active components and the MCM-D substrate; and (4) the MCM-D substrate must have a lossy property or support shorting via holes to suppress package-related parasitic modes caused by conducting backside.

Currently, the most widely used flip-chip substrates are based on alumina. The alumina substrate is an insulator substrate, and could be used to make a transmission line having good transmitting characteristics. Also, the CTE of alumina substrate, 6 ppm/° C., similar to that of the chip components, 7 ppm/° C., ensures a reliable flip-chip structure.

However, the high dielectric constant of the alumina substrate, about 9.8, can result in high proximity effects between the active components and the alumina substrate, and the relatively low thermal conductivity of the alumina substrate, 30 W/(m·K), in a poor dissipation of the heat generated by the active components.

To suppress the package-related parasitic modes, silicon substrates have been used as a substitute for the alumina substrates. However, the silicon substrate is saddled with a poor transmissibility. Referring to FIG. 1, there is shown a prior art flip-chip bonding structure including a Si-substrate 101, a dielectric layer 102, a transmission line 103, a flip-chip bump 104 and an active component 105. In the prior art, to solve the above-described shortcoming of the silicon substrate 101, a dielectric layer 102 having a low dielectric loss and a low dielectric constant, such as BCB (BenzoCyloButene), is coated on the entire surface thereof, making it possible to form a transmission line 103 with good transmitting characteristics. Further, the low dielectric constant of the dielectric layer 102 reduces the proximity effects between the silicon substrate 101 and the active component 105. However, in case of BCB, a relatively high CTE thereof, around 56 ppm/° C., compared to that of the active component 105, causes a mismatch of the CTEs between the silicon substrate 101 and the active component 105, which, in turn, causes cracks to form in the flip-chip bonding bump 104, thereby lowering the reliability of the flip-chip bonding structure. Also, the low thermal conductivity of BCB, around 0.02 W/(m·K), results in a poor dissipation of the heat generated by the active component.

SUMMARY OF THE INVENTION

It is, therefore, a primary object of the present invention is to provide a flip-chip bonding structure having an improved reliability and a heat dissipation factor.

In accordance with the present invention, there is a flip-chip bonding structure incorporating therein MCM-D (Multi Chip Module-Deposited) technology, the structure comprising: a silicon substrate; a Si-bump disposed at a predetermined position of the silicon substrate, wherein a material of the Si-bump is the same as the silicon substrate; a dielectric layer with a circuit formed thereon, the layer disposed on the silicon substrate; and a transmission line formed on the Si-bump to connect to the circuit formed on the dielectric layer.

It is to be understood that both the foregoing general description and the following detailed description of the present invention are exemplary and explanatory and are intended to provide further explanation of the invention as claimed.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENT

Figure 1:
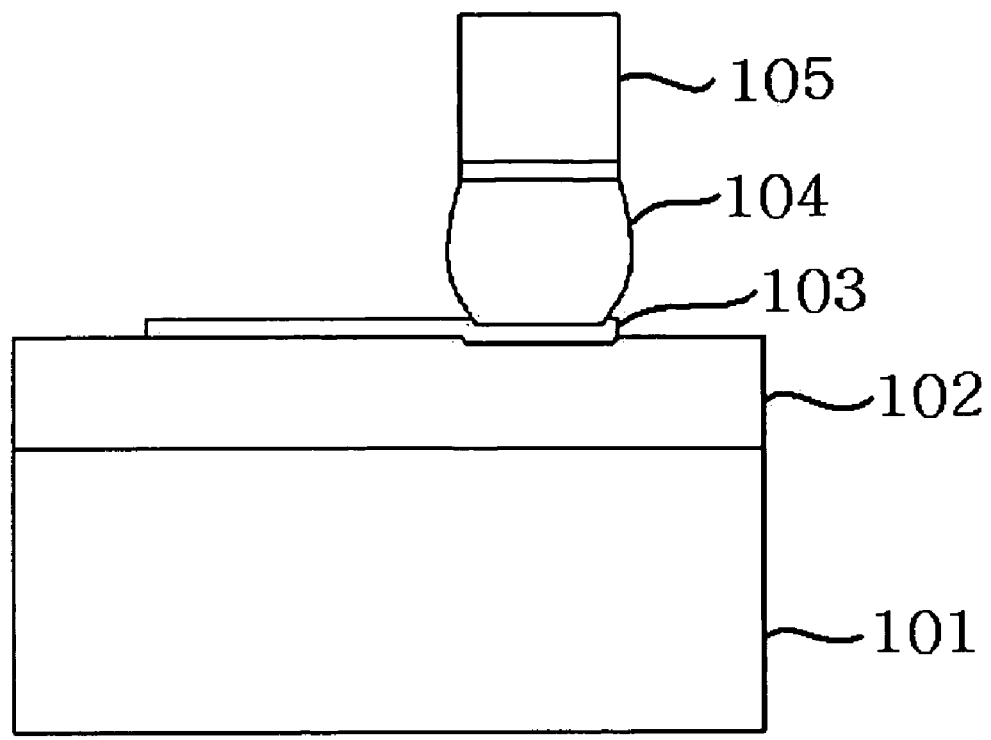
FIG. 1 illustrates a flip-chip bonding structure according to a prior art.

Herein, a preferred embodiment of the present invention will be described in detail with reference to the attached drawings. First, as for the references added to elements in the drawings, it is noted that like elements are preferably configured to have like references even though those are illustrated on different drawings. Further, as for description of the present invention, the detailed description may be omitted if it is apprehended that the gist of the present invention is obscured by the detailed description on the related prior construction or function.

Figure 2:
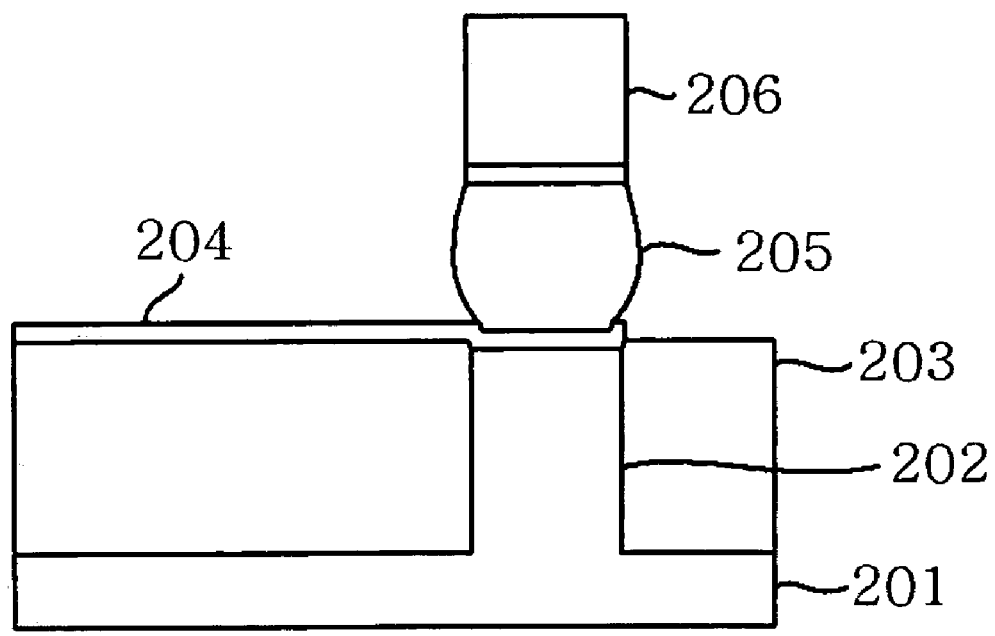
FIG. 2 presents a cross section of a flip-chip bonding structure using an MCM-D substrate in accordance with a preferred embodiment of the present invention.

Referring to FIG. 2, a cross section of a flip-chip bonding structure using an MCM-D substrate is illustrated according to one embodiment of the present invention, including a silicon substrate 201 with a Si-bump 202 formed thereon, a dielectric layer 203, a transmission line 204, a flip-chip bonding bump 205 and an active component 206, wherein the active component 206 is directly mounted on the Si-bump 202 of the silicon substrate 201 through the flip-chip bonding bump 205, as opposed to having the dielectric layer 102 disposed between the flip-chip bonding bump 104 and the substrate 101 in the prior art flip-chip bonding structure. Further, since the silicon substrate 201 and Si-bump 202 respectively have a CTE that matches the CTE of the active component 206, when the package is thermally cycled, the active component 206 and the Si-bump 202 expand at the same rate, which, in turn, reduces the stresses on the flip-chip bonding bump 205, distinguishing the present invention from the prior art flip-chip bonding structure. Also, since silicon has a higher thermal conductivity than a dielectric material, the Si-bump 202 of the present invention provides a more efficient thermal path through which the heat generated by the active component 206 can be dissipated, improving the over-all reliability of the flip-chip bonding structure.

Detailed explanations of the present invention are given referring to FIGS. 3a to 3f, FIGS. 4a to 4g, FIGS. 5a to 5f, and FIGS. 6a to 6g.

Example 1

FIGS. 3a to 3f illustrate a method for forming a flip-chip bonding structure using an MCM-D substrate according to one embodiment of the present invention.

Figure 3A:
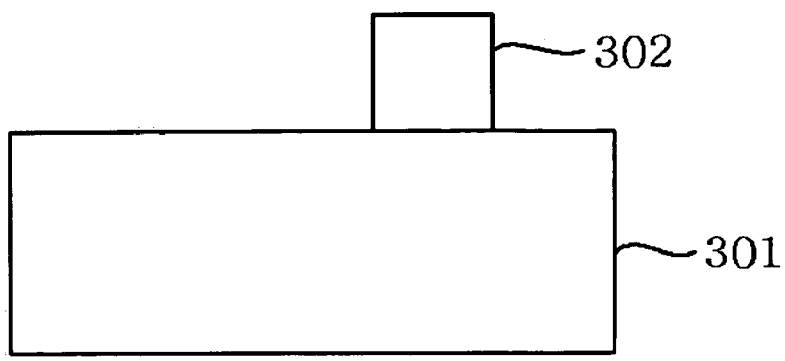
FIGS. 3a to 3f represent a method for forming a flip-chip bonding structure using an MCM-D substrate in accordance with another preferred embodiment of the present invention.

Referring to FIG. 3a, a photoresist pattern 302 is formed on a silicon substrate 301 to define an area on which a Si-bump is formed.

Figure 3B:
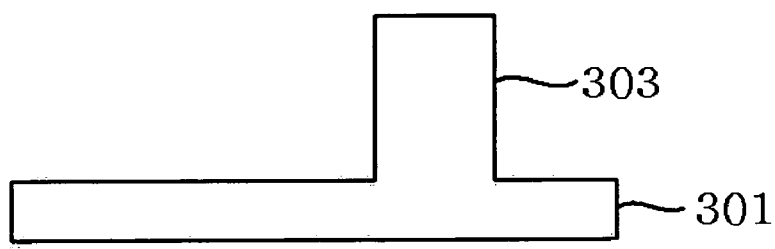

Referring to FIG. 3b, a Si-bump 303 is formed on the silicon substrate 301 by removing some portion of the silicon substrate 301 using the photoresist pattern 302 as an etching mask, wherein the Si-bump 303 has a height ranging from 10 µm to 100 µm and a diameter ranging from 30 µm to 200 µm. The Si-bump 303 is preferably cylindrical but may be formed in any other shapes.

Figure 3C:
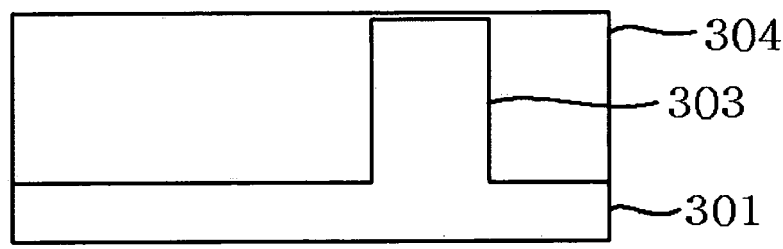

Referring to FIG. 3c, a dielectric layer 304 is deposited over the silicon substrate 301 and the Si-bump 303 so as to fill up a region where the silicon substrate 301 has been etched off. To achieve a good topology, the dielectric layer 304 can be slightly over-deposited on the top of the Si-bump 303. The dielectric layer 304 is preferably a single layer or multi-layer, which is formed of a material capable of being deposited by a spin-coating process, for example, BCB or polyimide. The spin-coating process can form a uniform and relatively flat dielectric layer because the Si-bump 303 has a very small size. Subsequently, a planarization process is performed. Here, if the dielectric layer 304 is formed of BCB, an additional planarization process such as etch-back can be omitted since the BCB has a high degree of planarization property.

Figure 3D:
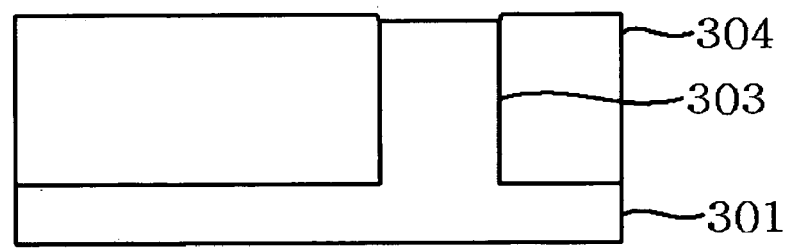

Referring to FIG. 3d, a mask pattern is formed on the photoresist (not shown) over the dielectric layer 304. The dielectric layer 304 on the Si-bump 303 is removed by an etching process using the photoresist pattern as an etching mask.

Figure 3E:
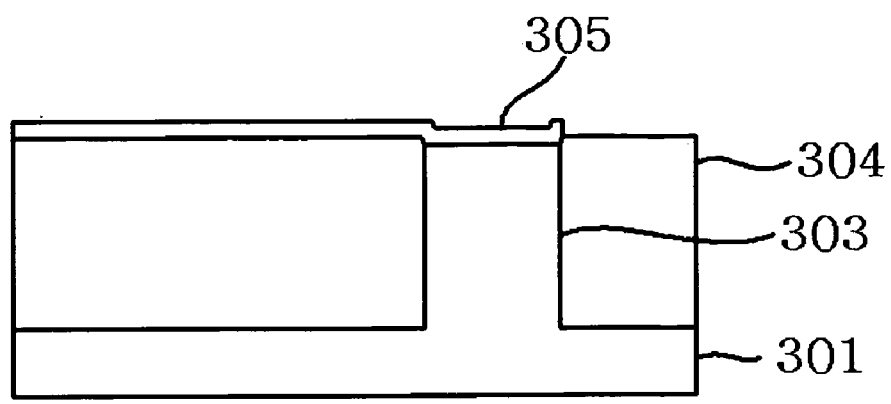

Referring to FIG. 3e, a transmission line 305 is formed over the Si-bump 303 and the dielectric layer 304. The transmission line 305 transmits a signal from an active component to adjacent circuits (not shown) formed on the dielectric layer 304.

Figure 3F:
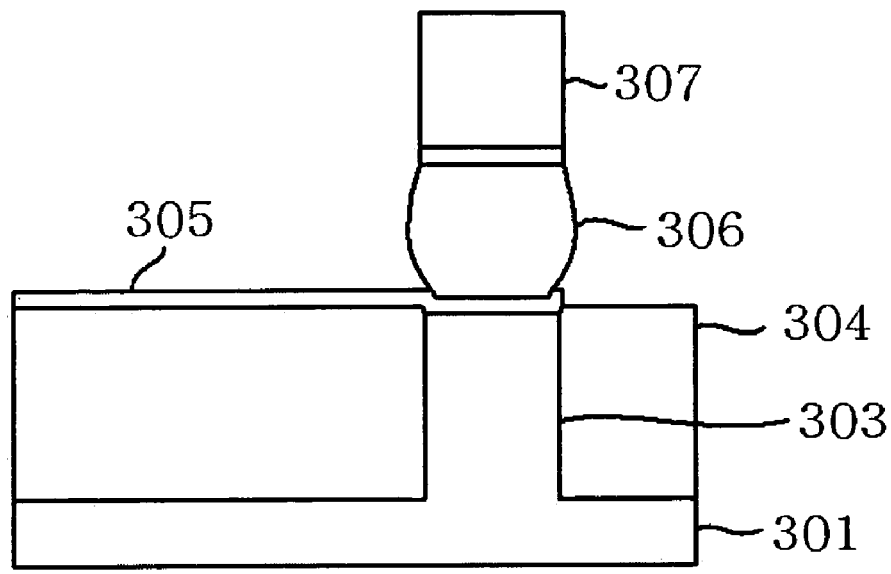

Finally, referring to FIG. 3f, a flip-chip bonding bump 306 is formed on the transmission line 305 above the Si-bump 303. Then, an active component 307 is mounted on the flip-chip bonding bump 306. The flip-chip bonding bump 306 is made of a conventional solder bump material.

Example 2

FIGS. 4a to 4g illustrate a method for forming a flip-chip bonding structure using an MCM-D substrate according to another preferred embodiment of the present invention.

Figure 4A:
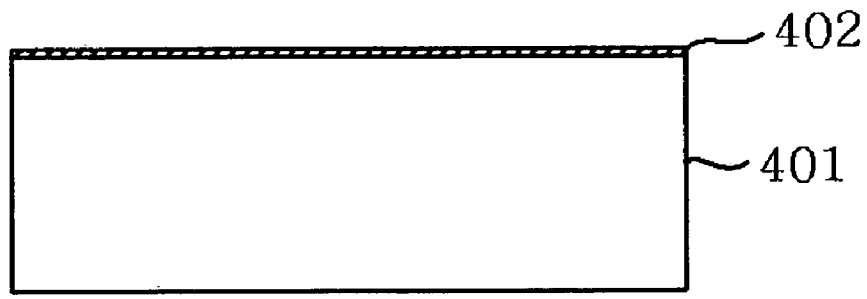
FIGS. 4a to 4g depict a method for forming a flip-chip bonding structure using an MCM-D substrate in accordance with yet another preferred embodiment of the present invention.

Referring to FIG. 4a, a lossy silicon substrate 401 is prepared. Due to an inherent property of lossy silicon, a DC leakage current occurs through the lossy silicon substrate 401. To prevent a DC leakage current from flowing through the silicon substrate 401, an insulating layer 402 is deposited on the lossy silicon substrate 401. The insulating layer 402 is formed of an oxide or a nitride. A thickness of the insulating layer 402 preferably ranges from 100 Å to 10000 Å.

Figure 4B:
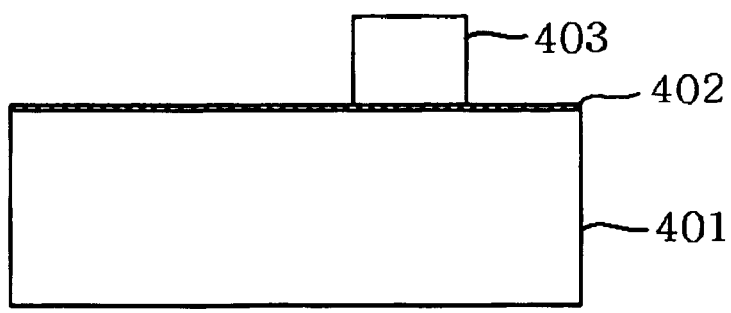

Referring to FIG. 4b, a photoresist pattern 403 is formed on the insulating layer 402 to define an area on which a Si-bump is formed.

Figure 4C:
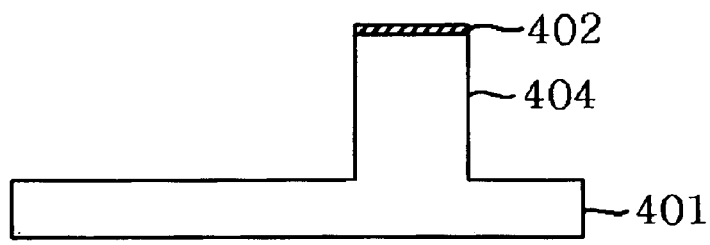

Referring to FIG. 4c, a Si-bump 404 is formed on the silicon substrate 401 by removing some portion of the insulating layer 402 and the silicon substrate 401 using the photoresist pattern as an etching mask. The Si-bump 404 has a height ranging from 10 µm to 100 µm and a diameter ranged from 30 µm to 200 µm. The Si-bump 404 is basically cylindrical but may be formed in any other shapes.

Figure 4D:
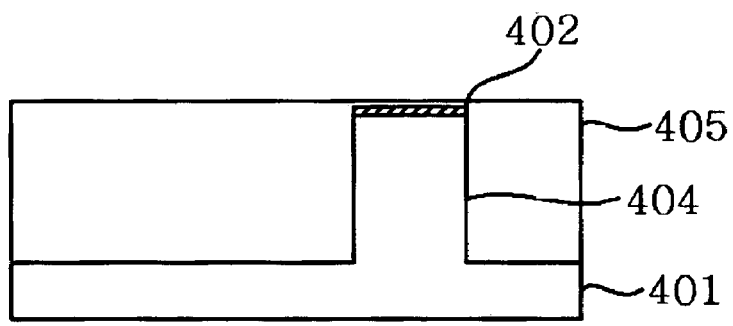

Referring to FIG. 4d, a dielectric layer 405 is deposited over the resulting structure so as to fill up a region where the silicon substrate 401 has been etched off. To achieve a good topology, the dielectric layer 405 is slightly over-deposited on the top of the Si-bump 404. The dielectric layer is preferably a single layer or multi-layer, which is formed of a material capable of being deposited by a spin-coating process, for example, BCB or polyimide. The spin-coating process can form a uniform and relatively flat dielectric layer because the Si-bump 404 has a very small size. Subsequently, a planarization process is performed. Here, if the dielectric layer 405 is formed of BCB, an additional planarization process such as etch-back can be omitted since the BCB has a high degree of planarization property.

Figure 4E:
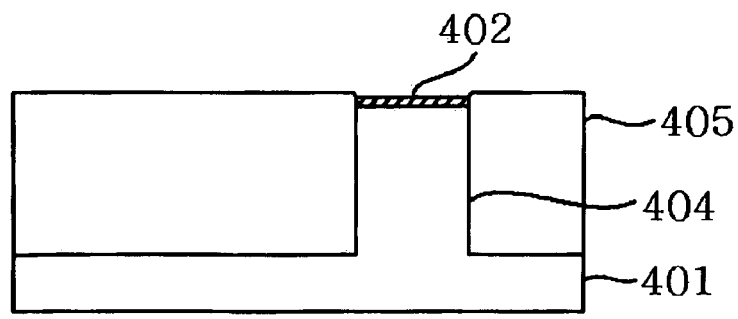

Referring to FIG. 4e, a mask pattern is formed on the photoresist (not shown) over the dielectric layer 405. The dielectric layer 405 over the Si-bump 404 is removed by an etching process using the photoresist pattern as an etching mask.

Figure 4F:
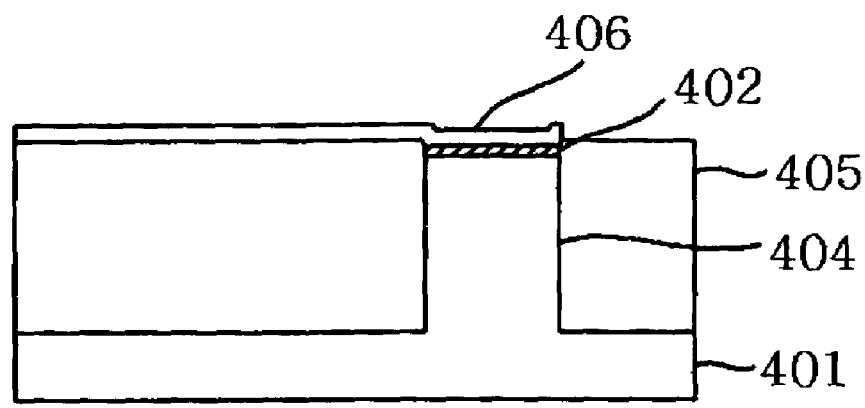

Referring to FIG. 4f, a transmission line 406 is formed on the insulating layer 402 and the dielectric layer 405. The transmission line 406 transmits a signal from an active component to adjacent circuits (not shown) formed on the dielectric layer 405.

Figure 4G:
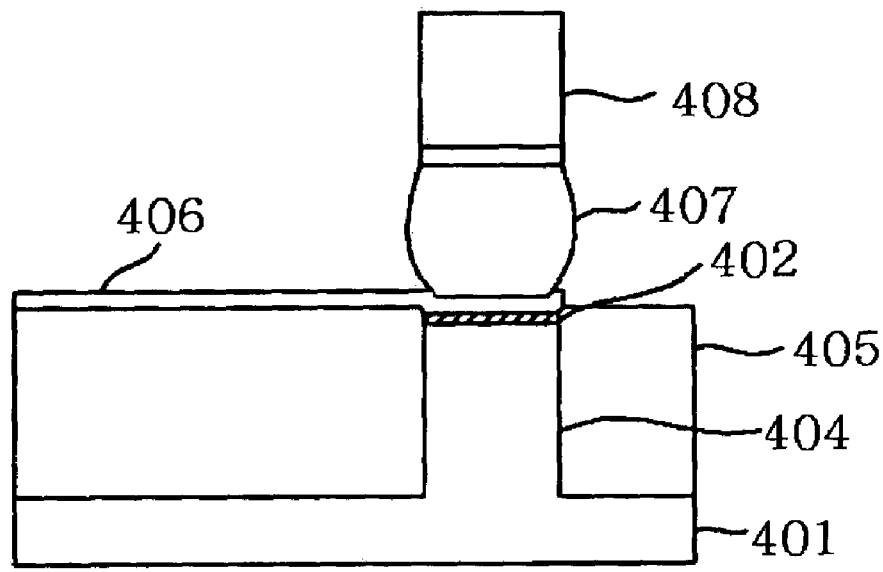

Finally, referring to FIG. 4g, a flip-chip bonding bump 407 is formed on the transmission line 406 above the Si-bump 404. Then, an active component 408 is mounted on the flip-chip bonding bump 407. The flip-chip bonding bump 407 is made of a conventional solder bump material.

Example 3

FIGS. 5a to 5f illustrate a method for forming a flip-chip bonding structure using an MCM-D substrate according to further embodiment in accordance with the present invention.

Figure 5A:
FIGS. 5a to 5f show a method for forming a flip-chip bonding structure using an MCM-D substrate in accordance with further embodiment of the present invention.

Referring to FIG. 5a, a silicon substrate 501 is prepared. A passivation layer 502 is deposited on the silicon substrate 501 and patterned to define a Si-bump region. The passivation layer 502 is needed to protect a Si-bump during a following etching process using a fluorine group material as an etchant. The passivation layer 502 is also used as an etching mask to form a Si-bump. Any metal which can not be etched by a fluorine group etchant, for example, Al, Au, or Ti/Au, can be used as the passivation layer 502. A thickness of the passivation layer 502 ranges from 500 Å to 10000 Å.

Figure 5B:
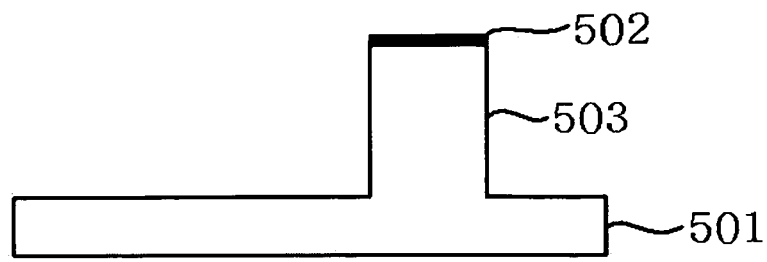

Referring to FIG. 5b, a Si-bump 503 is formed by removing some portion of the silicon substrate 501 using the passivation layer 502 as an etching mask. The Si-bump 503 has a height ranging from 10 µm to 100 µm and a diameter ranging from 30 µm to 200 µm. The Si-bump 503 is basically cylindrical in shape but may be formed in any other shapes.

Figure 5C:
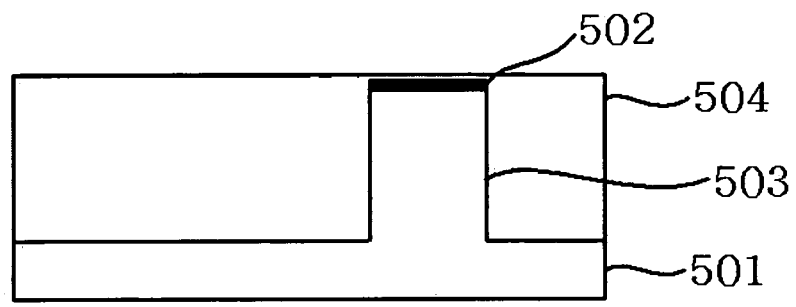

Referring to FIG. 5c, a dielectric layer 504 is deposited over the resulting structure so as to fill up a region where the silicon substrate 501 has been etched off. The dielectric layer 504 is formed of a BCB film by using a spin-coating process. The spin-coating process can form a uniform and flat dielectric layer because the Si-bump 503 has a very small size. The BCB, which is commonly used as a dielectric layer for mm-wave module, has a very low dielectric loss wherein the loss tangent is 0.0005, and a low dielectric constant, 2.65. The BCB film does not require a planarization process because of its good planarization property. The BCB film may be a single layer or multi-layer. To achieve a good topology, the dielectric layer 504 is slightly over-deposited on the top of the passivation layer 502. For example, if the height of the Si-bump 503 including the passivation layer 502 is around 20 µm, the BCB film is spin-coated and cured in a vacuum oven so as to attain a height of about 21 µm. In case of a multi-layer deposition, a first BCB film of 16 µm is formed to be followed by a second BCB film of 5 µm.

Figure 5D:
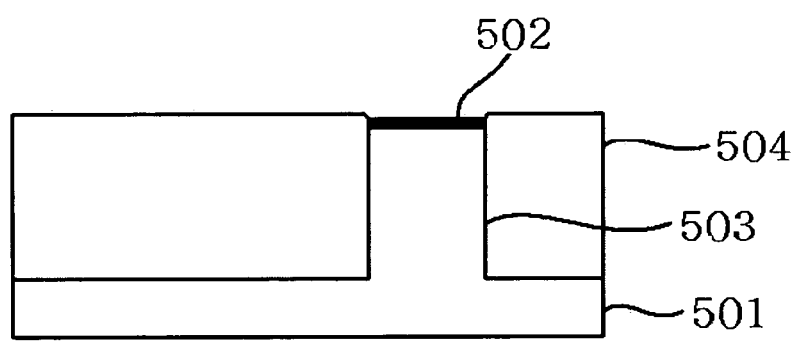

Referring to FIG. 5d, a mask pattern is formed on the photoresist (not shown) over the BCB film 504. The BCB film 504 over the passivation layer 502 can be removed by an etching process using the photoresist pattern as an etching mask and $SF_6/O_2$ or $CF_4/O_2$ as an etching gas. Here, the fluorine group etchant may etch not only the BCB film 504 but also the Si-bump 503. In the present invention, since the passivation layer 502, which is not etched with the fluorine group gas, is disposed on the Si-bump 503, thus protecting the Si-bump 503 from damages due to the fluorine group gas during the etching process.

Figure 5E:
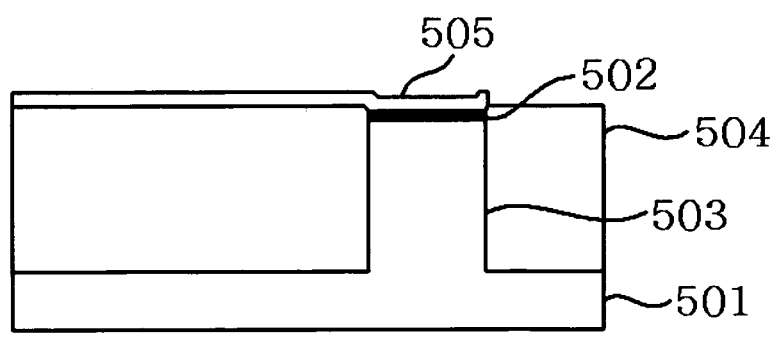

Referring to FIG. 5e, a transmission line 505 is formed on the passivation layer 502 and the dielectric layer 504. The transmission line 505 transmits a signal from an active component to adjacent circuits (not shown) formed on the dielectric layer 504.

Figure 5F:
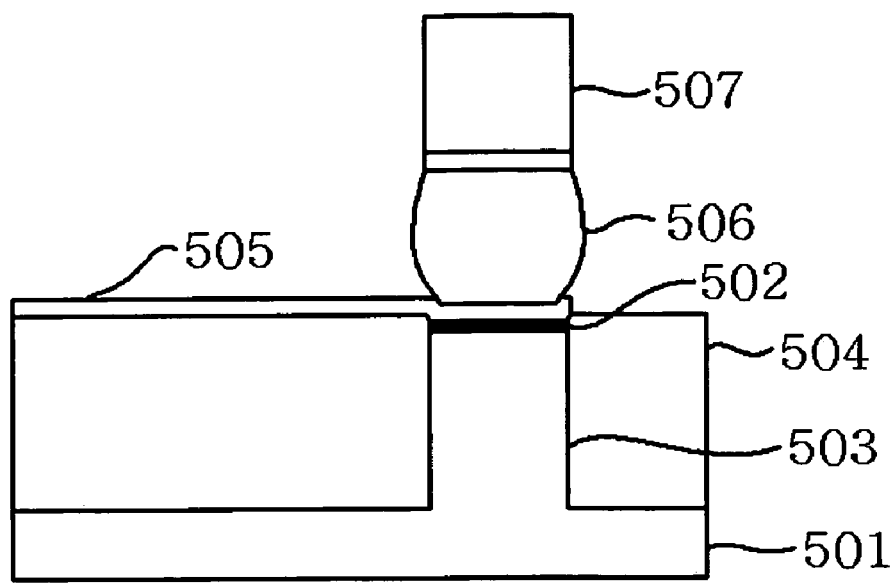

Finally, referring to FIG. 5f, a flip-chip bonding bump 506 is formed on the transmission line 505 above the Si-bump 503. The flip-chip bonding bump 506 is made of a conventional solder bump material. An active component 507 is then mounted on the flip-chip bonding bump 506.

Example 4

FIGS. 6a to 6g illustrate a method for forming a flip-chip bonding structure using an MCM-D substrate in accordance with a final embodiment of the present invention.

Figure 6A:
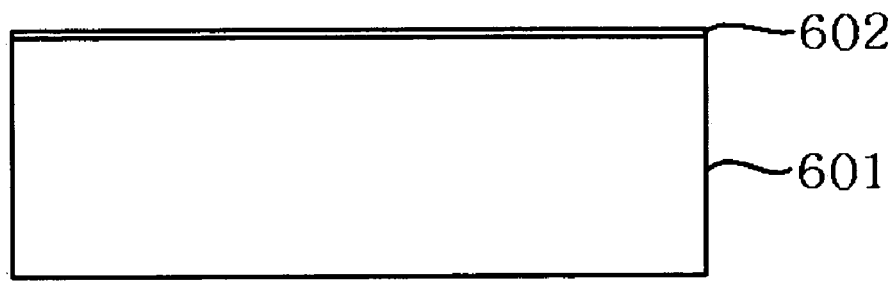
FIGS. 6a to 6g illustrate a method for forming a flip-chip bonding structure using an MCM-D substrate in accordance with the final embodiment of the present invention.

Referring to FIG. 6a, a lossy silicon substrate 601 is prepared. Due to an inherent property of lossy silicon, a DC leakage current occurs through the lossy silicon substrate 601. To prevent a DC leakage current from flowing through the lossy silicon substrate 601, an insulating layer 602 is deposited on the lossy silicon substrate 601. The insulating layer 602 is formed of an oxide layer or nitride layer. A thickness of the insulating layer 602 is preferably ranged from 100 Å to 1000 Å.

Figure 6B:
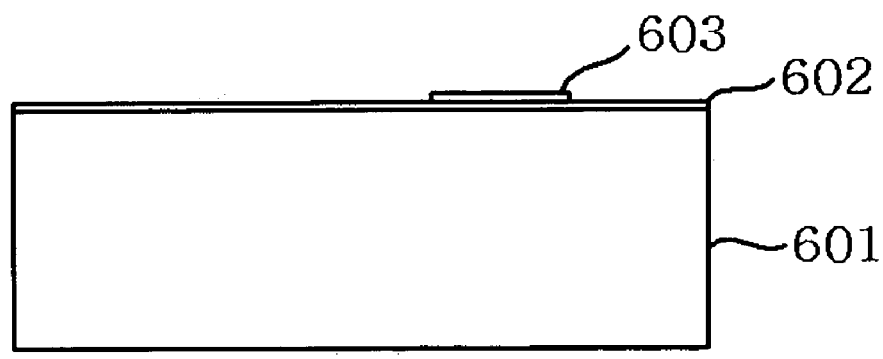

Referring to FIG. 6b, a passivation layer 603 is deposited on the insulating layer 602 and patterned to define a Si-bump region. The passivation layer 603 is needed to protect a Si-bump during a subsequent etching process using a fluorine group material as an etchant. The passivation layer 603 is also used as an etching mask for the subsequent silicon substrate etching to form a Si-bump. Any metal which is not etched by a fluorine group etchant, for example, Al, Au, or Ti/Au, can be used as the passivation layer 603. A thickness of the passivation layer 603 ranges from 500 Å to 10000 Å.

Figure 6C:
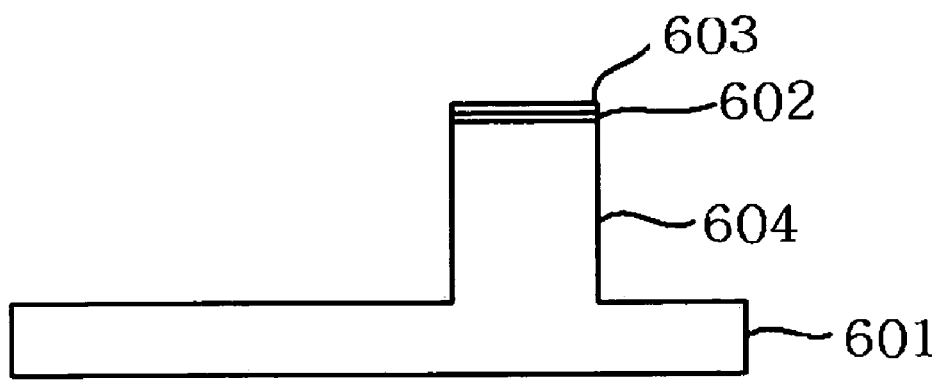

Referring to FIG. 6c, a Si-bump 604 is formed by removing some portion of the silicon substrate 601 and the insulating layer 602 using the passivation layer 603 as an etching mask. The Si-bump 604 has a height ranging from 10 µm to 100 µm and a diameter, ranging from 30 µm to 200 µm. The Si-bump 604 is basically cylindrical in shape but may be formed in any other shapes.

Figure 6D:
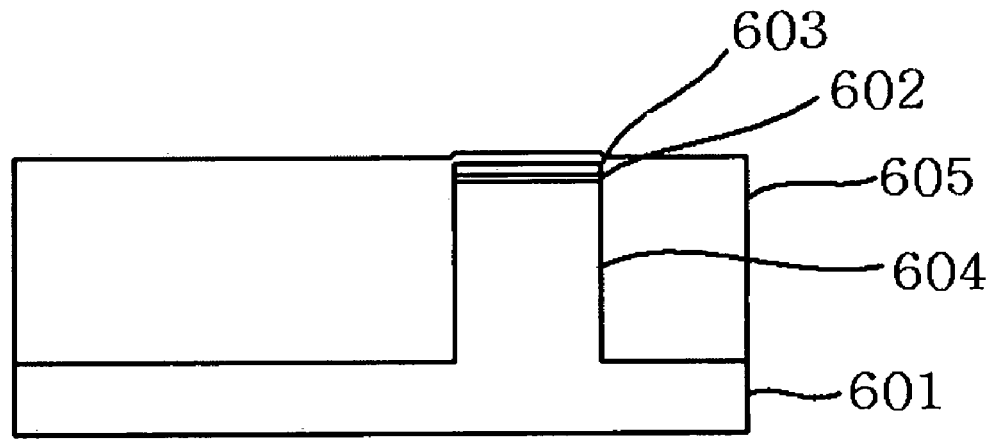

Referring to FIG. 6d, a dielectric layer 605 is deposited over the resulting structure so as to fill up a region where the silicon substrate 601 has been etched off. The dielectric layer 605 is formed of a BCB film by using a spin-coating process. The spin-coating process can form a uniform and flat dielectric layer because the Si-bump 604 has a very small size. The BCB film, which is commonly used as a dielectric layer for mm-wave module, has a very low dielectric loss wherein the loss tangent is 0.0005, and a low dielectric constant, 2.65. The BCB film does not require a planarization process because of its good planarization property. The BCB film 605 may be a single layer or multi-layer. To achieve a good topology, the dielectric layer 605 is slightly over-deposited on the top of the passivation layer 603. For example, if the height of the Si-bump 604 including the insulating layer 602 and the passivation layer 603 is around 20 µm, the BCB film 605 is spin-coated and cured in a vacuum oven to attain a height of about 21 µm. In case of a multi-layer deposition, a first BCB film of 16 µm is deposited, and a second BCB film of 5 µm is then formed.

Figure 6E:
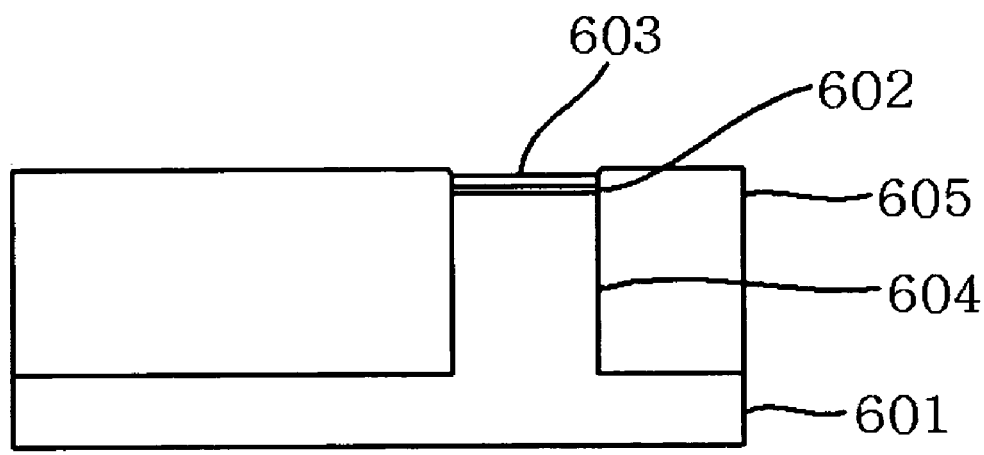

Referring to FIG. 6e, a mask pattern is formed on the photoresist (not shown) over the BCB film 605. The BCB film 605 over the passivation layer 603 is removed by an etching process using the photoresist pattern as an etching mask and $SF_6/O_2$ or $CF_4/O_2$ as an etching gas. Here, the fluorine group etchant may etch not only the BCB film 605 but also the Si-bump 604. In the present invention, since the passivation layer 603, which is not etched with the fluorine group gas, is disposed over the Si-bump 604, protecting the Si-bump 604 from damages due to the fluorine group gas during the etching process.

Figure 6F:
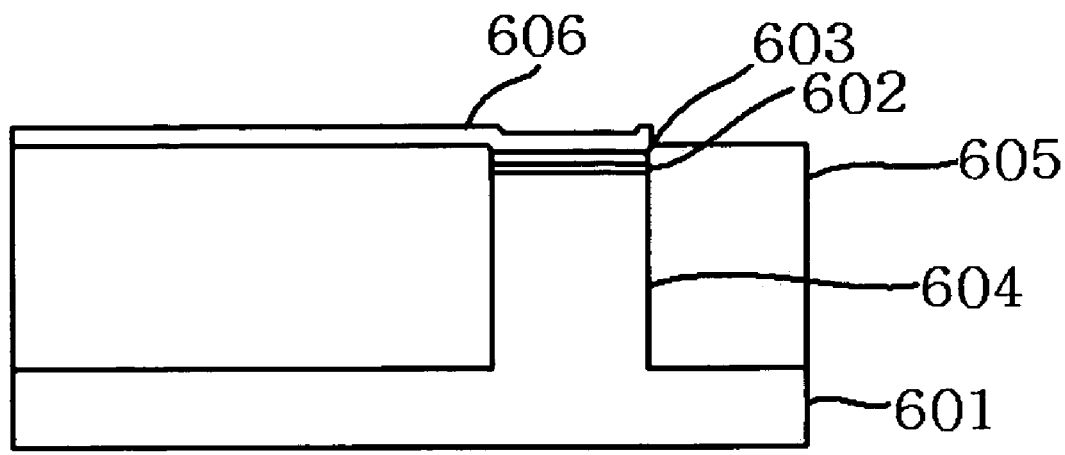

Referring to FIG. 6f, a transmission line 606 is formed on the passivation layer 603 and the dielectric layer 605. The transmission line 606 transmits a signal from an active component to adjacent circuits (not shown) formed on the dielectric layer 605.

Figure 6G:
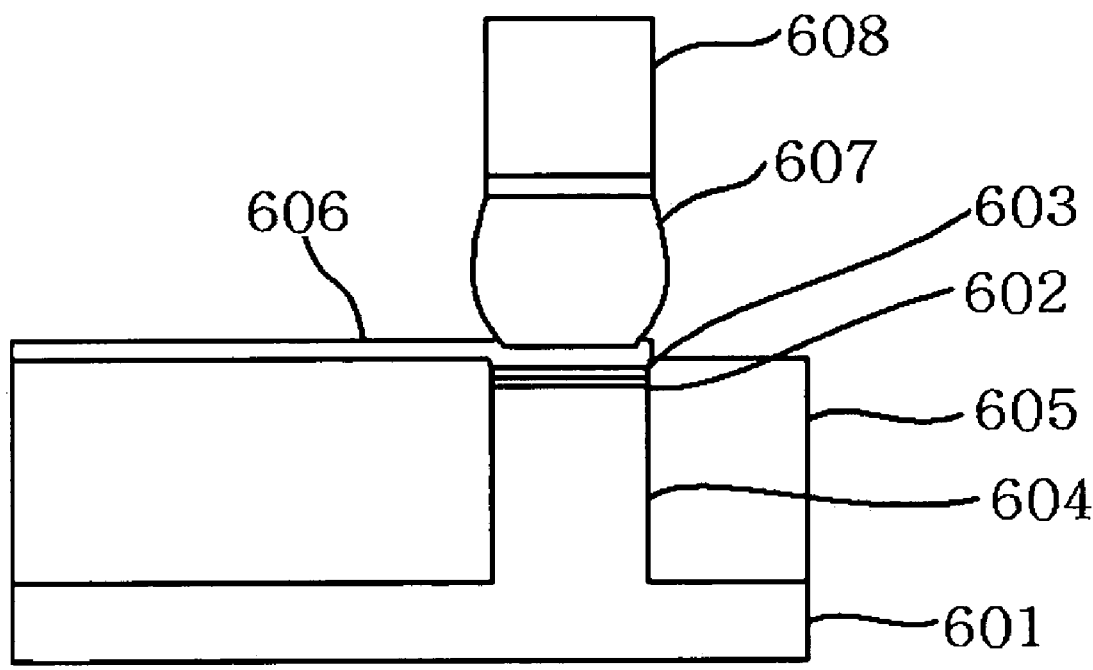

Finally, referring to FIG. 6g, a flip-chip bonding bump 607 is formed on the transmission line 606 above the Si-bump 604. The flip-chip bonding bump 607 is made of a conventional solder bump material. An active component 608 is then mounted on the flip-chip bonding bump 607.

It is noted that this patent claims priority from Korean Patent Application Serial Number 10-2005-0001536, which was filed on Jan. 7, 2005, and is hereby incorporated by reference in its entirety.

Although certain example methods, apparatus and articles of manufacture have been described herein, the scope of coverage of this invention is not limited thereto. On the contrary, this patent covers all methods, apparatus and articles of manufacture fairly falling within the scope of the appended claims either literally or under the doctrine of equivalents.

What is claimed is:

1. A flip-chip bonding structure using a multi-chip module-deposited (MCM-D) substrate comprising:
    a silicon substrate;
    a Si-bump disposed at a predetermined position of the silicon substrate, wherein the Si-bump is made of the same material as the silicon substrate;
    a dielectric layer disposed on the silicon substrate; and
    a transmission line formed on the silicon (Si)-bump to connect to a circuit formed on the dielectric layer.

2. The flip-chip structure as recited in claim 1, wherein a height of the Si-bump ranges from 10 μm to 100 μm.

3. The flip-chip structure as recited in claim 1, wherein a diameter of the Si-bump ranges from 30 μm to 200 μm.

4. The flip-chip bonding structure as recited in claim 1, wherein the dielectric layer is made of benzocylobutene (BCB) or polyimide.

5. The flip-chip bonding structure as recited in claim 1, further comprising
    an insulating layer disposed between the Si-bump and the transmission line.

6. The flip-chip bonding structure as recited in claim 5, wherein the Si-bump is made of lossy silicon.

7. The flip-chip bonding structure as recited in claim 5, wherein the insulating layer is one of oxide or nitride layer.

8. The flip-chip bonding structure as recited in claim 5, wherein the insulating layer has a thickness ranging from 100 Å to 10000 Å.

9. A flip-chip bonding structure using a multi-chip module-deposited (MCM-D) substrate comprising:
    a silicon substrate;
    a Si-bump disposed at a predetermined position on the silicon substrate, wherein the Si-bump is made of the same material as the silicon substrate;
    a dielectric layer disposed on the silicon substrate;
    a passivation layer disposed on the Si-bump; and
    a transmission line formed on the passivation layer to connect to a circuit formed on the dielectric layer.

10. The flip-chip bonding structure as recited in claim 9, wherein the dielectric layer is made of benzocylobutene (BCB).

11. The flip-chip bonding structure as recited in claim 9, wherein a height of the Si-bump ranges from 10 μm to 100 μm.

12. The flip-chip structure as recited in claim 9, wherein a diameter of the Si-bump ranges from 30 μm to 200 μm.

13. The flip-chip bonding structure as recited in claim 9, wherein the passivation layer has a thickness ranging from 500 Å to 10000 Å.

14. The flip-chip bonding structure as recited in claim 9, further comprising:
    an insulating layer disposed between the Si-bump and the passivation layer.

15. The flip-chip bonding structure as recited in claim 14, wherein the Si-bump is made of lossy silicon.

16. The flip-chip bonding structure as recited in claim 14, wherein the insulating layer is one of oxide or nitride layer.

17. The flip-chip bonding structure as recited in claim 14, wherein the insulating layer has a thickness ranged from 100 Å to 10000 Å.

* * * * *